United States Patent [19]

Viswanathan

[11] Patent Number: 4,484,089

[45] Date of Patent: Nov. 20, 1984

[54] SWITCHED-CAPACITOR CONDUCTANCE-CONTROL OF VARIABLE TRANSCONDUCTANCE ELEMENTS

[75] Inventor: Thayamkulangara R. Viswanathan, Monroeville, Pa.

[73] Assignee: AT&T Bell Laboratories, Murray Hill, N.J.

[21] Appl. No.: 409,363

[22] Filed: Aug. 19, 1982

[51] Int. Cl.³ .................. H03K 3/013; H03K 17/693; H03F 1/30; H03G 3/30

[52] U.S. Cl. .................................. 307/297; 307/310; 307/353; 307/491; 307/494; 328/127; 328/151; 330/282; 330/289; 333/19; 333/173

[58] Field of Search ................... 307/200 B, 491, 493, 307/494, 501, 502, 352, 353, 246, 575, 297, 310; 323/312–317; 328/127, 151, 175; 330/282, 285, 289, 144, 145; 333/19, 173, 217

[56] References Cited

U.S. PATENT DOCUMENTS

| | | | |
|---|---|---|---|
| 4,331,894 | 5/1982 | Gregorian et al. | 307/352 X |
| 4,374,357 | 2/1983 | Olesin et al. | 307/297 X |
| 4,375,595 | 3/1983 | Ulmer et al. | 307/297 |
| 4,384,217 | 5/1983 | Tsividis | 307/310 X |
| 4,408,130 | 10/1983 | Boll | 307/491 X |
| 4,441,080 | 3/1984 | Saari | 330/282 X |
| 4,446,438 | 5/1984 | Chang et al. | 307/494 X |

Primary Examiner—Stanley D. Miller
Assistant Examiner—David R. Hudspeth
Attorney, Agent, or Firm—Lucian C. Canepa

[57] ABSTRACT

Many signal processing applications of practical importance (for example, continuous-signal filtering) require high-precision temperature-insensitive transconductance elements. In accordance with one feature of this invention, a reference transconductance element is included in a control loop. The element consists of a MOSFET device or a MOSFET circuit in the loop. In the loop, the transconductance of the reference element is determined solely by the value and switching period of a switched-capacitor. The transconductance of the element is in effect thereby precisely matched against the conductance of the switched-capacitor.

As the temperature of the chip varies, a control voltage is generated in the loop to maintain the transconductance of the reference element constant. This same control voltage is applied to other similar elements included in circuits (for example, filters) on the chip. In that way, the transconductances of these other elements are also matched to that of the switched-capacitor. Significantly, the time constants in the circuits are thus made substantially temperature-insensitive, being proportional only to the product of the switching period of the switched-capacitor and to the ratio of capacitances on the chip.

In accordance with another feature of the invention, a switched-capacitor and a reference voltage source are utilized as a standard for establishing a prespecified current and maintaining it substantially independent of temperature variations. In one specific embodiment, this current is in turn utilized to bias an associated differential pair thereby to maintain its transconductance temperature-insensitive.

13 Claims, 8 Drawing Figures

SWITCHED-CAPACITOR CONDUCTANCE-CONTROL OF VARIABLE TRANSCONDUCTANCE ELEMENTS

BACKGROUND OF THE INVENTION

This invention relates to variable transconductance elements and, more specifically, to switched-capacitor conductance-control of such elements to render them substantially temperature-insensitive.

It is known to make large-scale-integrated (LSI) circuits on a single semiconductor chip by utilizing standard metal-oxide-semiconductor (MOS) fabrication techniques. In the MOS technology, dense arrays of field-effect-transistor (FET) devices and high-quality small-valued capacitors are easily realized. But conventional diffused or polysilicon resistance elements formed in an MOS chip typically consume an undesirably large part of the available chip area. Moreover, such elements are temperature sensitive. As the temperature of the chip changes, the resistance values of these elements also change. In turn, such temperature-caused changes deleteriously affect the operating characteristics of LSI circuits such as high-precision active filters.

It is further known that a MOSFET device can be used as a voltage-controlled resistor for small signals of either polarity. But the resistance of such a device also varies with temperature. Thus, even for small-signal operation, MOSFET devices as heretofore proposed are not suitable for utilization in high-precision applications where resistors characterized by substantial insensitivity to temperature variations are required.

An attractive approach is available for providing small-area temperature-insensitive resistance elements in MOS chips. This approach is based on emulating resistive behavior by utilizing switched-capacitor techniques. The application of these techniques to, illustratively, the design of high-precision active filters is well known, as described, for example, by R. W. Brodersen, P. R. Gray and D. A. Hodges in "MOS Switched-Capacitor Filters," *Proceedings of IEEE*, Vol. 67, pages 61–75, January 1979. The operating characteristics of such filters are determined by highly stable crystal-controlled clock frequencies and capacitor ratios.

The temperature coefficient of an MOS capacitor is typically exceedingly low. And it is known that the temperature coefficient of capacitor ratios is even lower. In practice, the variation with temperature of MOS capacitor networks is thus so low as to be insignificant in almost all applications. Accordingly, switched-MOS capacitors are an advantageous basis for realizing high-precision LSI circuits that are substantially temperature-insensitive.

A circuit such as a switched-capacitor filter is in effect a sampled-data network. Accordingly, signals applied thereto must first be band-limited. This is done, for example, by utilizing a so-called antialiasing filter which is a filter of the continuous-signal type. Hence, the antialiasing filter is representative of LSI circuits that cannot be realized utilizing switched-capacitor techniques. For such circuits, therefore, a need exists for some way other than the switched-capacitor approach for implementing small-area temperature-insensitive resistors.

Moreover, although the aforespecified switched-capacitor techniques as applied, for example, to filtering are advantageous in the audio-frequency range, the use of such techniques at higher frequencies becomes more difficult and may lead to an undesirably high level of switching noise. Thus, especially for operation at higher frequencies, a need exists for a low-noise substitute for switched-capacitors in important applications such as filtering. For such applications, a small-area temperature-insensitive continuous transconductance element would obviously be a highly advantageous component.

SUMMARY OF THE INVENTION

Hence, an object of the present invention is an improved transconductance element. More specifically, an object of this invention is to provide variable transconductance elements that exhibit substantially temperature-insensitive characteristics.

Briefly, these and other objects of the present invention are realized in specific illustrative embodiments thereof in each of which the substantially temperature-insensitive conductance of a switched-capacitor arrangement is utilized as a precise standard against which to match the transconductance of a primary variable transconductance element. The transconductance of the primary variable element is thereby maintained substantially constant as the temperature of the element changes. Advantageously, the switched-capacitor and the primary element are formed on an integrated circuit chip.

During the matching process, a control voltage is generated. This voltage is applied to the primary variable element to maintain its transconductance constant. The same control voltage is applied to other variable transconductance elements that comprise, for example, components included in continuous active filters formed on the same integrated circuit chip. These other or secondary elements are identical or ratioed versions of the primary element. Moreover, these other elements are assumed to be subject to the same temperature changes as the primary element. Accordingly, the control voltage applied to these other elements is also effective to maintain their respective transconductances substantially insensitive to temperature changes.

In one specific illustrative embodiment of the principles of the present invention, the primary variable element, as well as each of the secondary elements, comprises simply a single MOSFET device. For relatively small-signal-operation, such a device can function adequately as a variable resistor.

In another embodiment of the invention, each of the aforespecified variable transconductance elements constitutes a unique circuit configuration that comprises only multiple MOSFET devices. In this circuit configuration, the square-law characteristic of MOSFET devices is utilized as a basis for providing an output current proportional to the product of two input voltages. One of these inputs is the aforespecified control voltage obtained from matching the transconductance of the primary element with the conductance of a switched-capacitor reference. The circuit exhibits a relatively large dynamic range for input signals and a relatively low total harmonic distortion.

In still other embodiments of the invention, a switched-capacitor and a reference voltage source are utilized as a standard for establishing a prespecified current and maintaining it substantially independent of temperature variations. One such embodiment includes, for example, at least one associated differential pair whose transconductance is maintained substantially temperature-insensitive.

BRIEF DESCRIPTION OF THE DRAWING

A complete understanding of the present invention and of the above and other features thereof may be gained from a consideration of the following detailed description presented hereinbelow in connection with the accompanying drawing in which.

DETAILED DESCRIPTION

Herein, the term "transconductance" will be employed in a generic sense to encompass both transconductance and self-conductance.

Figure 1:
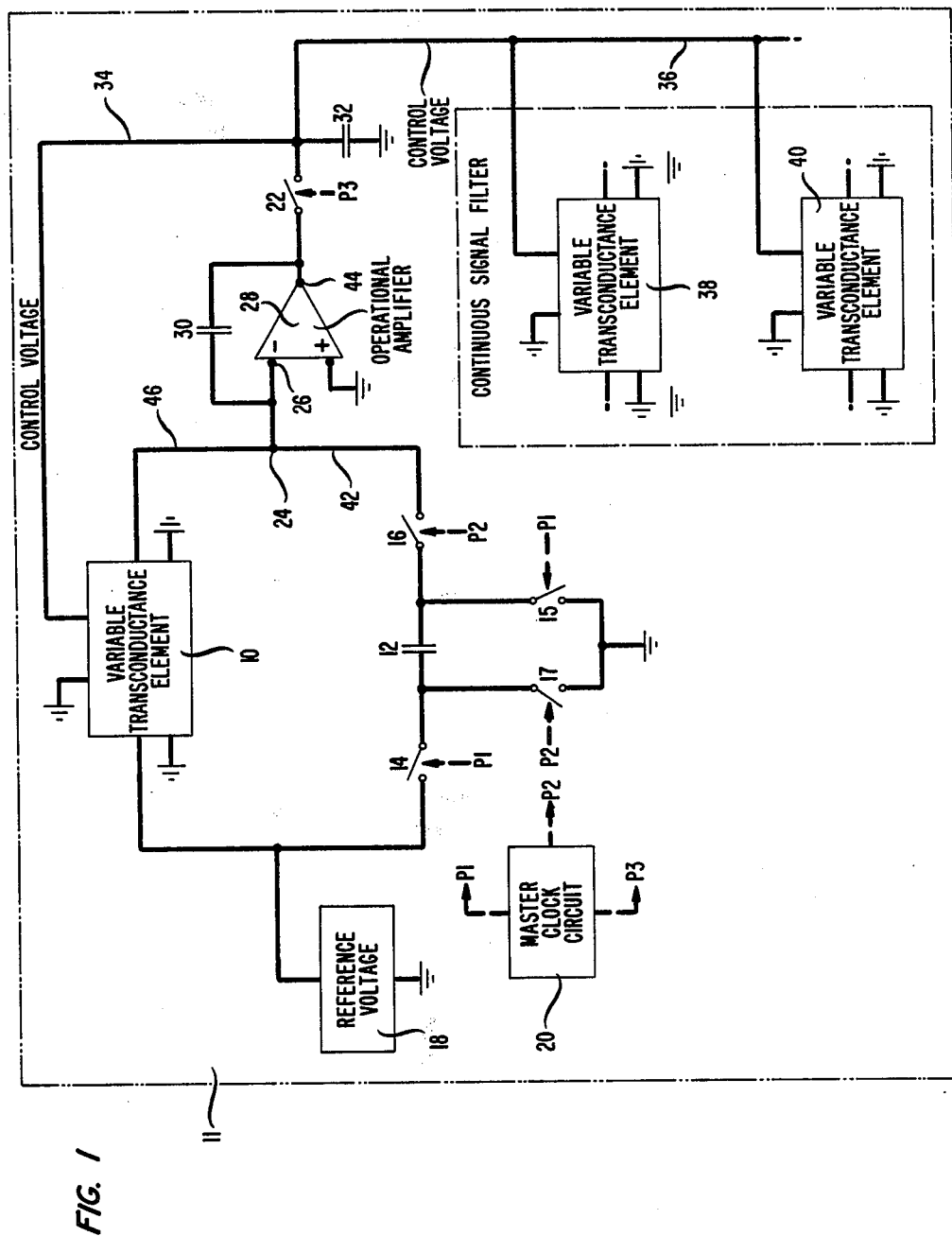
FIG. 1 is a generalized schematic depiction of switched-capacitor conductance-control of variable transconductance elements in accordance with applicant's inventive principles.

Illustratively, the configurations described below are assumed to be embodied in integrated circuits made by utilizing standard fabrication techniques known in the art. Each of these configurations, for example the basic overall one depicted in FIG. 1, is assumed to be included on a single chip. By way of example, it is advantageous to fabricate such chips employing conventional complementary-metal-oxide-semiconductor (CMOS) technology. In the CMOS technology, a dense array comprising only n-channel and p-channel MOSFET devices and high-quality small-valued (less than about 100 picofarad) capacitors is readily achieved in a relatively simple fabrication process.

In the basic configuration shown in FIG. 1, the transconductance of a primary variable transconductance element 10 formed in an integrated circuit chip 11 is in effect matched against the conductance of a known switched-capacitor. Various specific illustrative implementations of the element 10 will be described below.

The switched-capacitor of FIG. 1 comprises a capacitor 12 whose value is $C_1$ picofarads. Illustratively, the capacitor is connected to associated clocked switches 14 through 17 and a reference voltage 18 in the specific manner shown. The particular depicted switched-capacitor is an especially advantageous one characterized by a substantial insensitivity to the effects of parasitic capacitances, as described by K. Martin and A. S. Sedra in "Strays-Insensitive Switched-Capacitor Filters Based on Bilinear Z-Transform", *Electronic Letters*, Vol. 15, No. 13, pages 365–366, 1979.

By way of example, each of the switches 14 through 17 (FIG. 1) comprises a single MOSFET device operated in a conventional way as an ON-OFF switch by control pulses applied thereto from a master clock circuit 20. The circuit 20, whose operation is based on a standard highly stable quartz-controlled unit, is assumed to be substantially temperature-insensitive.

Figure 3:
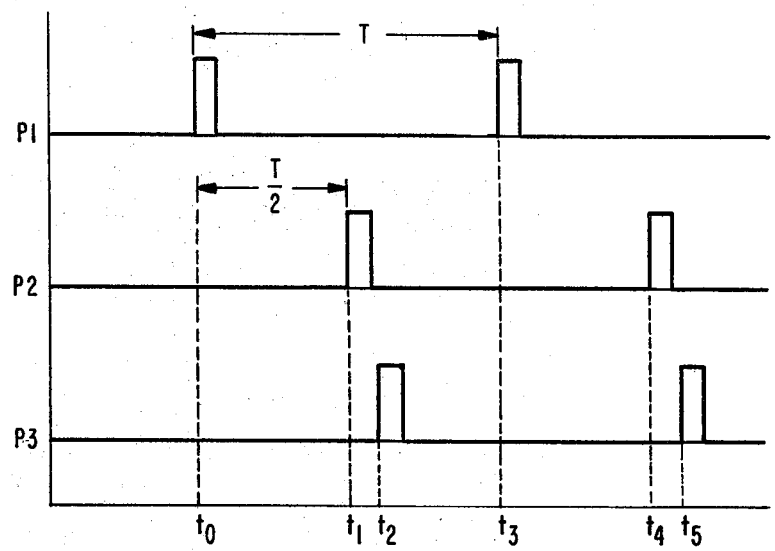
FIG. 3 is a timing diagram showing clock pulses utilized to control the operation of the embodiments depicted in FIGS. 1, 2, 5 and 6.

The outputs of the master clock circuit 20 are pulse trains P1, P2 and P3, as shown in FIG. 3. In response to and for the duration of each P1 pulse, the switches 14 and 15 are each closed. Otherwise, the switches 14 and 15 are open, as indicated in FIG. 1. Similarly, in response to and for the duration of each P2 pulse, the switches 16 and 17 are each closed. Pulse train P3 is utilized to control the operation of switch 22 whose function will be described later below. In FIG. 3, T represents the clock period of the depicted pulses.

When it is closed, the switch 16 of FIG. 1 connects the capacitor 12 to node point 24. In turn, the node point 24 is directly connected to the non-inverting input terminal 26 (virtual ground) of a conventional operational amplifier 28. The amplifier 28 in conjunction with capacitor 30 (whose value is designated $C_2$) forms a standard integrator, as is well known in the art.

The output of the integrator shown in FIG. 1 is periodically sampled and applied via the switch 22 to an output capacitor 32. The voltage appearing across the capacitor 32 serves as a control voltage that is applied via lead 34 to establish and maintain the transconductance of the variable transconductance element 10 at a prespecified value. This same control voltage is applied via lead 36 to multiple other or secondary variable transconductance elements included in the chip 11. Two such other elements 38 and 40 are indicated in FIG. 1. These other elements are either identical to or ratioed counterparts of the primary element 10. Illustratively, the elements 38 and 40 are components of a continuous active filter also formed in the chip 11.

The operation of the FIG. 1 circuit commences at $t_0$ (FIG. 3) when a pulse P1 is applied to the switches 14 and 15. This serves to connect the capacitor 12 across the reference voltage 18. The value of the reference voltage is designated herein as $V_R$. Hence, the capacitor 12 charges to the voltage $V_R$. Subsequently, at $t_1$, a pulse P2 is applied to the switches 16 and 17. This causes the charge $C_1 V_R$ stored on the capacitor 12 to flow from the node point 24 downward in lead 42. In effect, this constitutes a current flow $$\frac{C_1 V_R}{T}$$

out of the node point 24. As a result, the voltage at output terminal 44 of the amplifier 28 increases by an increment $$\frac{C_1 V_R}{C_2}.$$

At $t_2$ (FIG. 3), a pulse P3 causes the newly incremented output voltage of the amplifier 28 to be applied to and stored in the capacitor 32. As this stored value increases, the transconductance of the element 10 increases, thereby supplying more current into the node point 24. The influence of this current is to decrease the output voltage of the operational amplifier. Thus, there is a negative feedback effect in the depicted circuit. In the steady-state, the value of the current delivered by the tansconductance element 10 to the node point 24 is $G_{VTE} V_R$, where $G_{VTE}$ is the transconductance of the element 10.

In the steady-state, the two aforespecified processes, namely, discrete charge removal from the integrator via the switched-capacitor and continuous charge supply to the integrator from the element 10, balance each other. Significantly, any unbalance between these processes causes the output voltage of the integrator to change so as to restore the charge-balance condition.

In the charge-balance condition, the current flowing from the node point 24 (FIG. 1) toward the switched-capacitor equals the current flowing from the variable transconductance element 10 into the node point 24. As specified above, the magnitudes of these currents are $$\frac{C_1 V_R}{T}$$

and $G_{VTE} V_R$, respectively. Hence, in the steady-state balanced condition $$\frac{C_1 V_R}{T} = G_{VTE} V_R \quad (1)$$

which reduces to $$\frac{C_1}{T} = G_{VTE}. \quad (2)$$

Thus, it is seen that the transconductance of the primary element 10 is matched to the conductance of the switched-capacitor. And this conductance is determined solely by the value of the capacitor 12 and the clock period T, both of which are substantially temperature-insensitive.

Moreover, the voltage applied to the primary element 10 of FIG. 1 to control its transconductance is also applied to the secondary elements 38 and 40. Accordingly, the transconductances of these secondary elements are also thereby each matched to the switched-capacitor conductance. The time constants of continuous filters that include the elements 38, 40 (and associated capacitors) thus are proportional only to the product of the clock period T and the ratio of $C_1$ to the filter capacitances.

When the temperature of the chip 11 (FIG. 1) changes, all components thereon including the elements 10, 38 and 40 are assumed to be subjected to substantially the same temperature variation. Thus, for example, if the temperature of the chip 11 increases, the prespecified transconductance of the primary element 10 tends to decrease. But, as it decreases, the control voltage applied via the lead 34 to the element 10 changes to cause the transconductance of the element 10 to be maintained at the prespecified value. Similarly, the transconductances of the secondary elements 38 and 40 are also thereby maintained at their respective prespecified values.

Figure 2:
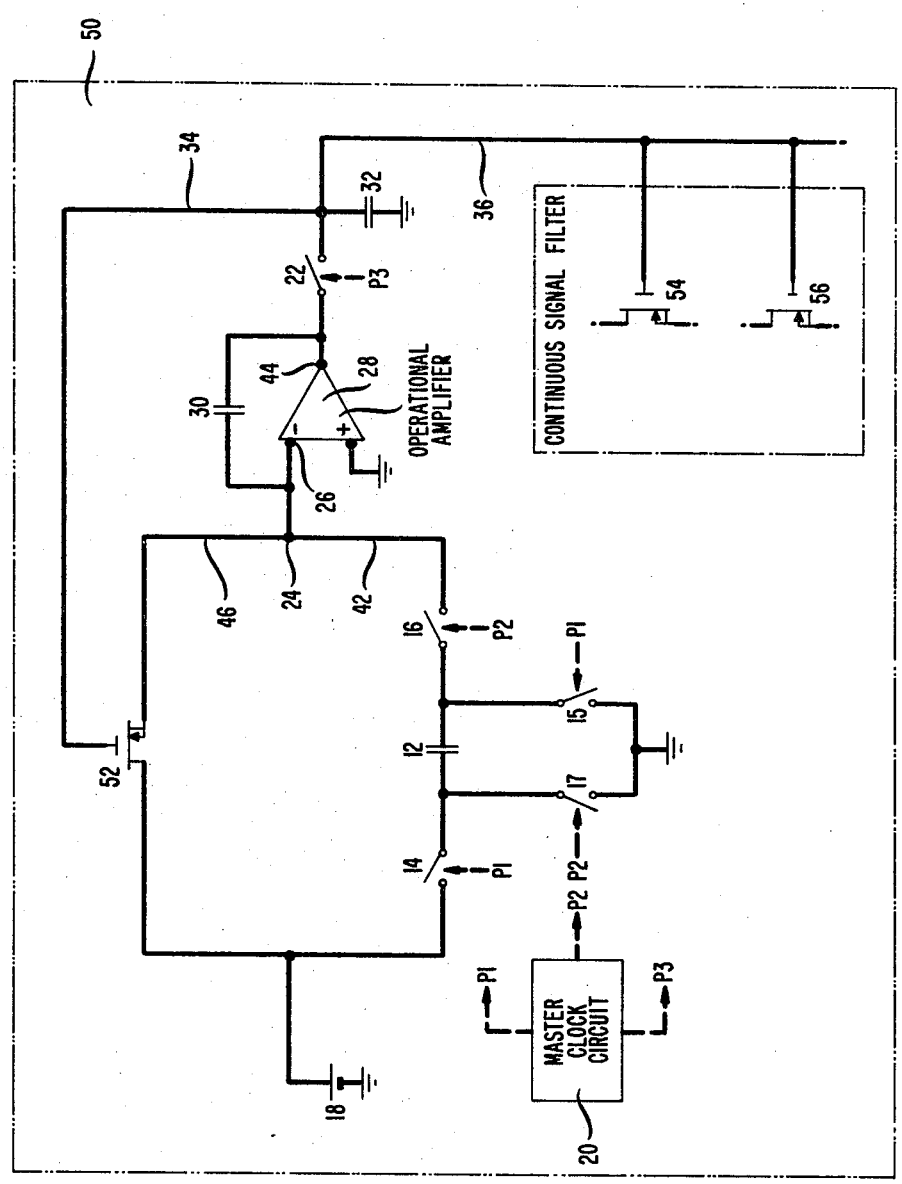
FIG. 2 is a specific illustrative embodiment of FIG. 1 in which each variable element comprises a single MOSFET device.

Various specific illustrative implementations are feasible for the variable transconductance elements 10, 38 and 40 represented in FIG. 1. In one such implementation, each of these elements comprises a single MOSFET device. A chip 50, including a single-MOSFET primary element 52 and single-MOSFET secondary elements 54 and 56, made in accordance with the principles of applicant's invention is schematically depicted in FIG. 2. The other components in FIG. 2 are identical to the corresponding ones in FIG. 1 and are accordingly designated by the same reference numerals.

By way of example, each of the MOSFETs 52, 54 and 56 shown in FIG. 2 is a standard n-channel device. In accordance with this invention, each device is operated in a non-saturating small-signal mode in a substantially linear portion of its voltage-current characteristic. The devices are either identical to each other or ratioed versions of each other. Illustratively, the lengths of the depicted devices are the same but their widths are different thereby to realize different specified transconductances.

Single-MOSFET elements exhibit a limited dynamic range for input signals and a relatively poor harmonic-distortion characteristic. Accordingly, other practicable implementations for these elements are desired. One such other implementation employs so-called differential pairs of MOSFET devices, as described below.

Figure 4:
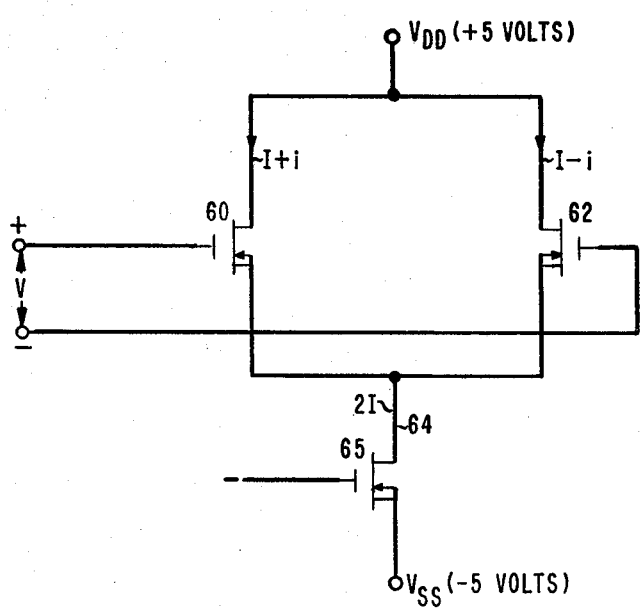
FIG. 4 illustrates two MOSFET devices interconnected in a standard way to form a conventional differential pair known in the art.

First, by way of background, FIG. 4 shows a conventional differential-pair circuit arrangement. The arrangement comprises two identical MOSFET devices 60 and 62 biased by a current 2I provided by a MOSFET device 65. Illustratively, these devices are all of the n-channel type and they are each biased to operate in saturation. Quiescently, that is, in the absence of a voltage difference between the gate electrodes of the devices 60 and 62, the bias current 2I divides equally between the drain-to-source paths of the devices 60 and 62.

Assume that a small-amplitude voltage signal v is applied between the gate electrodes of the devices 60 and 62, as indicated in FIG. 4. In response thereto, the current flowing in the drain-to-source path of the device 60 increases by an amount i, whereas the current in the drain-to-source path of the device 62 decreases by the same amount i. As before, the current flowing in the lead 64 is 2I.

For the differential pair shown in FIG. 4, it is well known that $$i = \sqrt{kI} \; v, \quad (3)$$

where k is a temperature-dependent parameter associated with each FET. Hence, the small-signal incremental transconductance $G_{DP}$ of the differential pair is given by $$G_{DP} = \sqrt{kI}. \quad (4)$$

In numerous applications of practical importance, a need exists for generating bias currents which are substantially independent of temperature. The circuit shown in FIG. 5 achieves this provided the reference source 18 is substantially temperature-insensitive. Such sources are available. An example of such an available source is the well-known band-gap reference.

Figure 5:
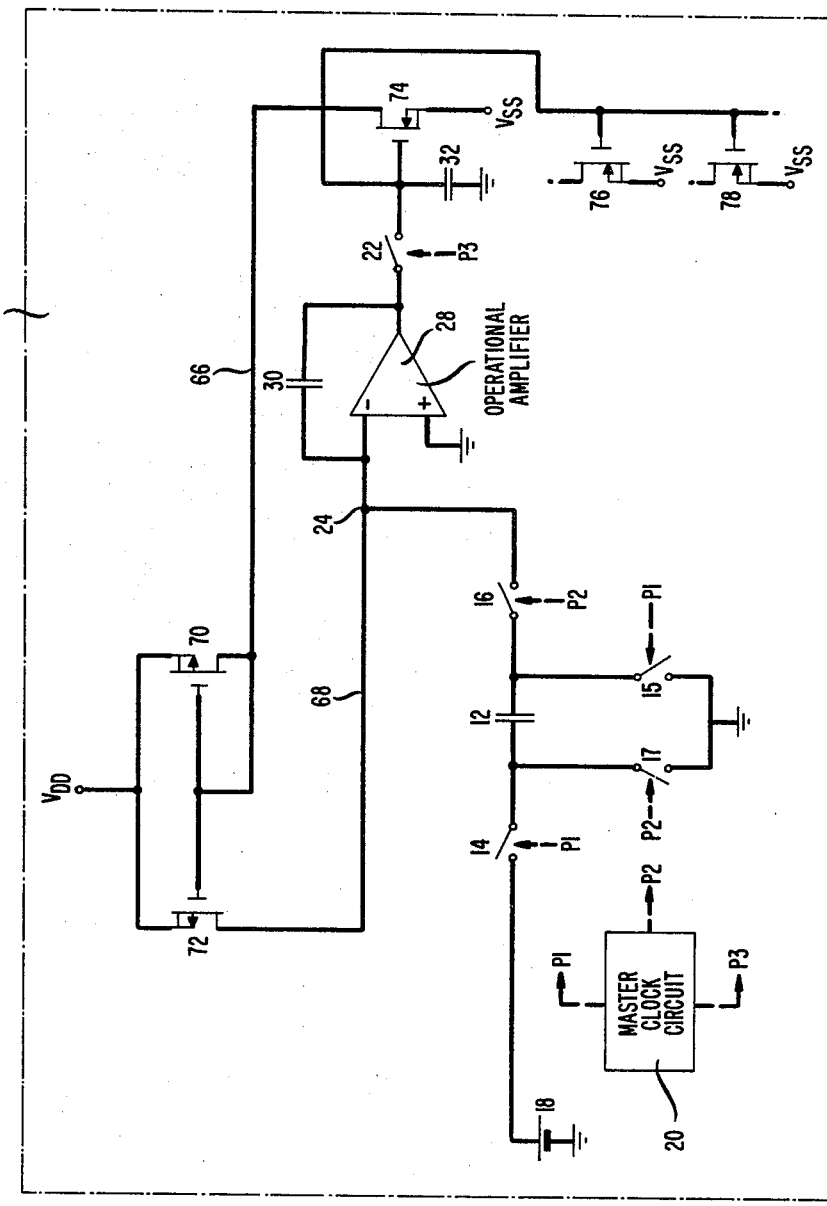
FIG. 5 shows a current mirror connected in a switched-capacitor conductance-control loop in a manner devised by applicant to maintain constant bias currents.

In accordance with a feature of the principles of applicant's invention, an arrangement designed to maintain a constant current I flowing in each of leads 66 and 68 emanating from the respective drain electrodes of a standard current mirror comprising p-channel devices 70 and 72, is shown in FIG. 5. The current flowing in the lead 68 of FIG. 5 into node point 24 is $$I = \frac{C_1 V_R}{T}. \quad (5)$$

As indicated earlier, $C_1$ and T are substantially temperature-insensitive. Moreover, highly stable, substantially temperature-insensitive voltage references are known. Thus, if due to temperature variations, the current I tends to change from its prespecified value, the voltage across the capacitor 32 changes in a compensating manner to alter the gate voltage of n-channel MOSFET device 74. In turn, this maintains the current flowing in each of the leads 66 and 68 at the prespecified value.

Advantageously, the voltage utilized to control the MOSFET device 74 of FIG. 5 is also applied to the gate electrodes of devices 76 and 78. The devices 76 and 78 are identical or ratioed versions of the device 74. Hence, the current flowing in the drain-to-source path of each of the devices 76 and 78 is also thereby maintained constant. These currents may constitute, for example, bias currents utilized in associated high-precision circuitry (not shown) on chip 80. In that way, these bias currents are maintained constant regardless of temperature changes.

Additionally, applicant recognized that if the constant voltage $V_R$ supplied by the independent voltage source 18 shown in FIG. 5 were replaced by a dependent voltage source defined by $$V_R = \sqrt{\frac{I}{k}}, \quad (6)$$

the transconductances of associated differential pairs could be maintained constant. This is seen if expression (6) is substituted for $V_R$ in expression (5). The substitution yields $$\sqrt{kI} = \frac{C_1}{T}. \quad (7)$$

But, as indicated earlier above, $$G_{DP} = \sqrt{kI}. \quad (8)$$

Thus, $$G_{DP} = \frac{C_1}{T}. \quad (9)$$

Switched-capacitor conductance control of the transconductance of a differential pair is thus seen to be achievable.

Figure 6:
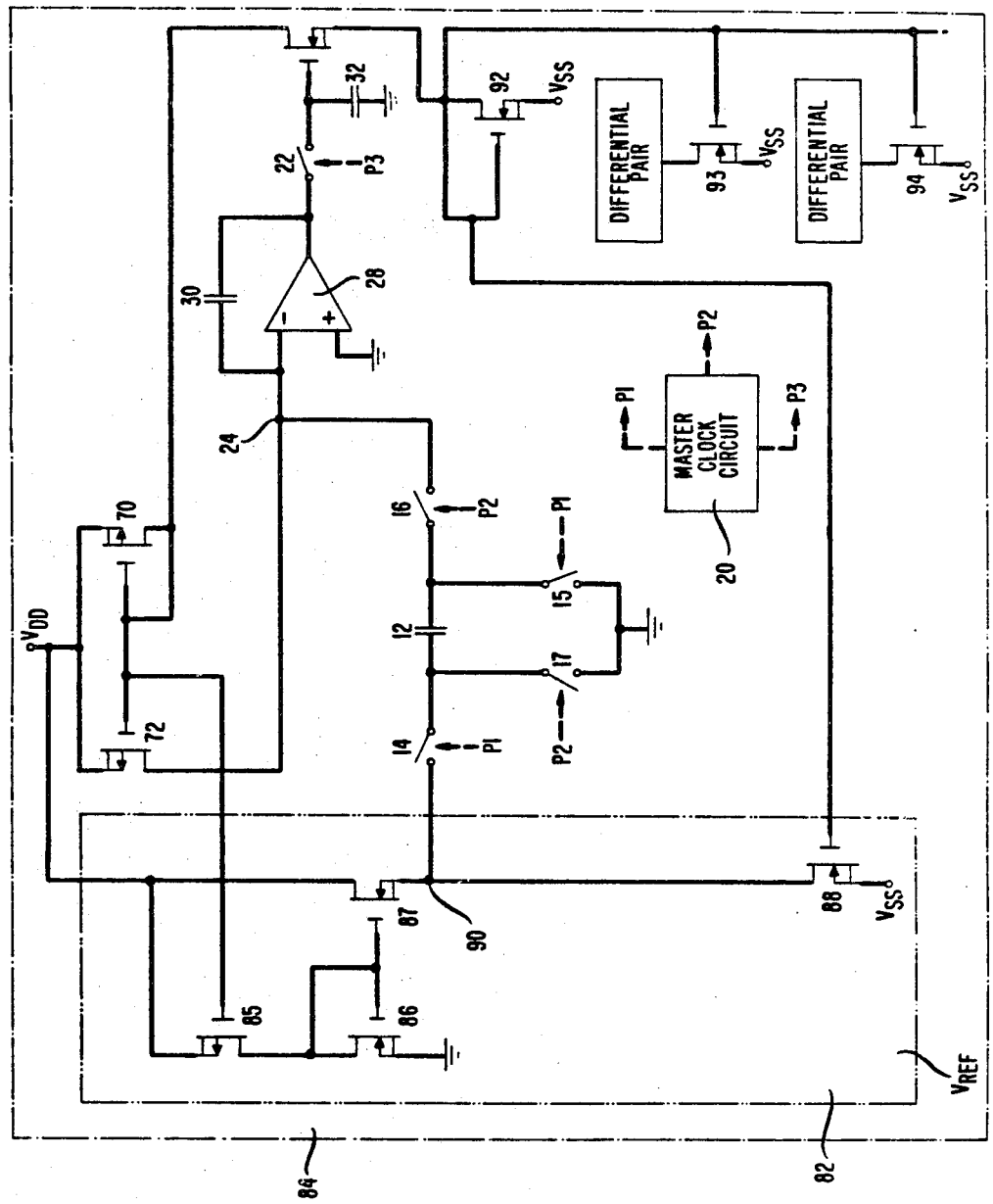
FIG. 6 depicts an illustrative arrangement in which a switched-capacitor control loop is utilized to generate bias currents that in turn are employed to maintain the transconductances of differential pairs constant.

A specific illustrative circuit for providing a reference voltage $V_R$ as defined by expression (6) is shown in FIG. 6 within dashed-line box 82 on chip 84. The circuit, which comprises MOSFET devices 85 through 88, provides at node point 90 a voltage $V_R$ defined by expression (6). As is well known, a standard so-called starter circuit (not shown) is required to initiate operation of the dependent voltage source 82 shown in FIG. 6.

In FIG. 6, the p-channel MOSFET device 85 included in the voltage reference circuit 82 is designed to be identical to the two matched p-channel devices 70 and 72. Illustratively, the n-channel devices 86 and 87 in the voltage reference circuit are designed such that their lengths are the same but the width of the device 87 is about four times that of the width of the device 86. Further, the n-channel device 88 in the voltage reference circuit is designed to be identical to or a ratioed version of the devices 92 through 94 included on the chip 84.

The devices 93 and 94 shown in FIG. 6 are used to bias differential pairs included on the chip 84. Importantly, these currents are controlled by the switched-capacitor arrangement as indicated to make the transconductances of the differential pairs each proportional to the conductance $C_1/T$ of the switched-capacitor. In that way, the transconductances of the differential pairs are in practice maintained substantially temperature-insensitive.

The aforespecified differential pairs, controlled in the manner described, are generally advantageous compared to single-MOSFET arrangements of the type shown in FIG. 5. But, for a variety of practical applications of commercial importance, differential pairs do not exhibit a sufficiently large dynamic range for input signals, nor sufficiently low distortion, to be considered attractive.

Figure 7:
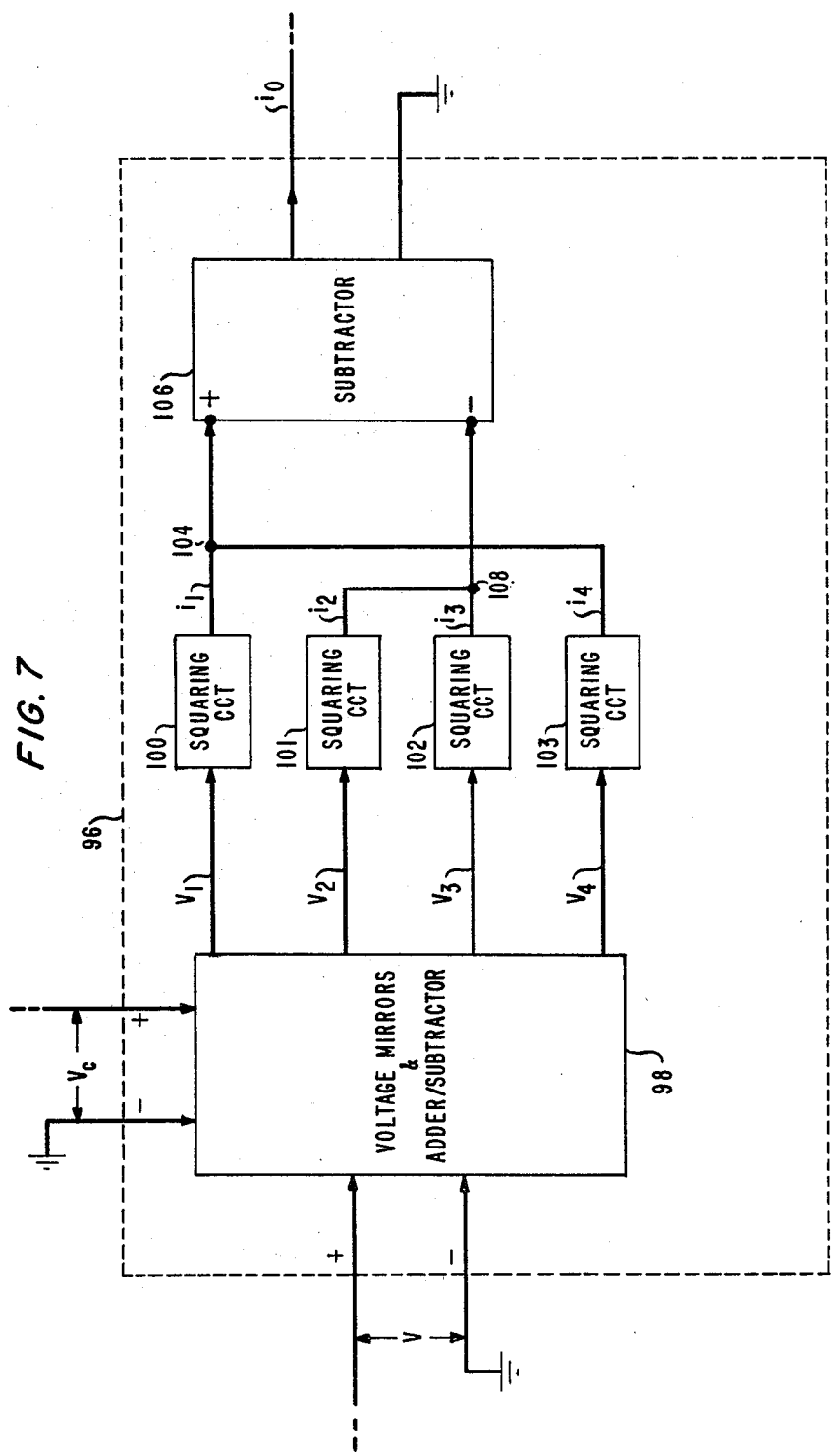
FIG. 7 is a block diagram representation of a particularly advantageous variable transconductance element suitable for inclusion in the FIG. 1 depiction.

In accordance with another feature of the principles of the present invention, an advantageous variable transconductance element with improved characteristics relative to single MOSFETs and differential pairs is provided. A block diagram representation of this improved element is shown in FIG. 7. Box 96 in FIG. 7 constitutes a specific illustrative representation of each of the elements 10, 38 and 40 shown in the overall arrangement of FIG. 1.

The element shown in FIG. 7 comprises only multiple n-channel and p-channel MOSFET devices each of which individually exhibits a square-law current-voltage characteristic for large-dynamic-range (for example, three-volt) input signal swings. By utilizing the well-known quarter-square principle, applicant has combined individual such square-law devices to form an overall arrangement that provides an output current $i_0$ that is linearly proportional to the product of an input control voltage $v_c$ and a large-dynamic-range signal voltage v.

The FIG. 7 element comprises a block 98 that includes voltage mirrors and adder/subtractor circuitry. In the block 98, internal voltages $v_{c1}$ and $v_{c2}$ defined by $$v_{c1} = v_{c2} \alpha v_c \quad (10)$$

are generated. The voltage $v_{c1}$ is the common mode component of $v_1$ and $v_2$, and $v_{c2}$ is the common mode component of $v_3$ and $v_4$, where $$v_1 \alpha v_{c1} + v, \quad (11)$$

$$v_2 \alpha v_{c2} - v, \quad (12)$$

$$v_3 \alpha v_{c2} + v, \quad (13)$$

and $$v_4 \alpha v_{c2} - v. \quad (14)$$

As indicated in FIG. 7, the outputs of the block 98 are the aforespecified voltages $v_1$, $v_2$, $v_3$ and $v_4$. These voltages are respectively applied to squaring circuits 100 through 103 each of which comprises a single MOSFET device. The respective outputs of the circuits 100 through 103 are currents $i_1$, $i_2$, $i_3$ and $i_4$ defined by $$i_1 \alpha (v_{c1}+v)^2, \quad (15)$$

$$i_2 \alpha (v_{c1}-v)^2, \quad (16)$$

$$i_3 \alpha (v_{c2}+v)^2, \quad (17)$$

and $$i_4 \alpha (v_{c2}-v)^2. \quad (18)$$

The output currents $i_1$ and $i_4$ are added at node point 104 and applied to the positive input terminal of a subtractor 106, whereas the output currents $i_2$ and $i_3$ are added at node point 108 and applied to the negative input terminal of the subtractor 106.

The output current $i_0$ of the subtractor 106 of FIG. 7 is therefore defined by $$i_0 \alpha (i_1 + i_4) - (i_2 + i_3) \quad (19)$$

or $$i_0 \alpha 4v(v_{c1} - v_{c2}) \quad (20)$$

which, from expression (10), reduces to $$i_0 \alpha v v_c. \quad (21)$$

Thus, as indicated earlier above, the output current $i_0$ of the FIG. 7 arrangement is seen to be linearly proportional to the product of the input control voltage $v_c$ and the input signal voltage $v$.

Figure 8:
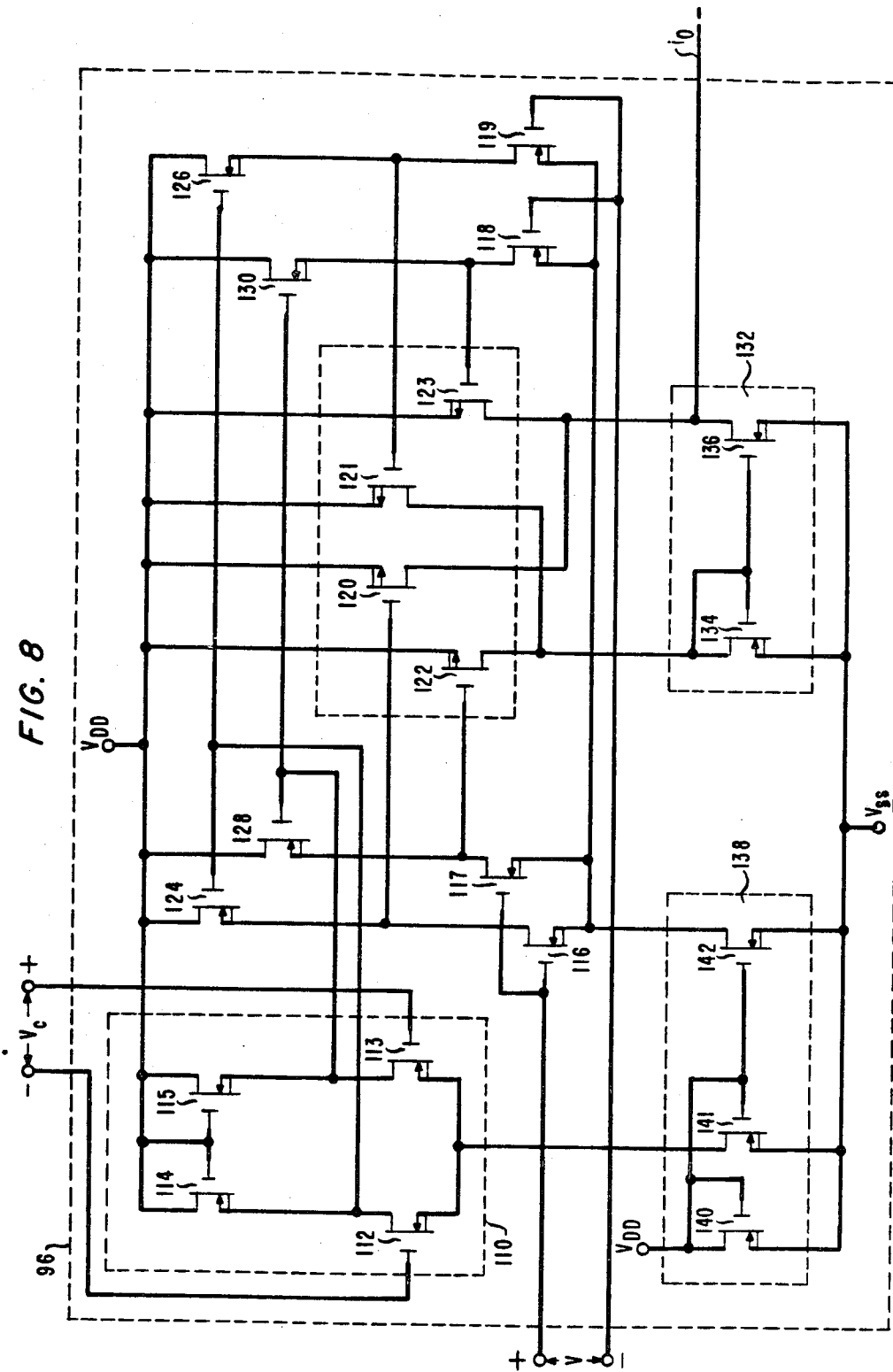
FIG. 8 is a specific illustrative all-MOSFET circuit embodiment of FIG. 7.

A specific illustrative all-MOSFET implementation of the box 96 of FIG. 7 is shown in FIG. 8. FIG. 8 includes a control voltage ($v_c$) mirror buffer 110 that comprises n-channel devices 112 through 115. Additionally, FIG. 8 includes a signal voltage ($v$) mirror buffer that comprises n-channel devices 116 through 119, 124, 126, 128 and 130. For identical matched p-channel devices 120 through 123 respectively comprise the squaring circuits 100 through 103 shown in FIG. 7.

In FIG. 8, n-channel devices 116 and 124 combine $+v$ and $v_{c1}$ and apply a gate-to-source voltage proportional thereto to the squaring device 120. Devices 119 and 126 combine $-v$ and $v_{c1}$ and apply a gate-to-source voltage proportional thereto to the squaring device 121. Similarly, devices 117 and 128 combine $+v$ and $v_{c2}$ and apply a gate-to-source voltage proportional thereto to the squaring device 122. Further, devices 118 and 130 combine $-v$ and $v_{c2}$ and apply a gate-to-source voltage proportional thereto to the squaring device 123.

A subtractor circuit 132 shown in FIG. 8 comprises n-channel devices 134 and 136. Bias circuit 138, comprising n-channel devices 140 through 142, establishes predetermined currents in the depicted arrangement.

In FIG. 8, the devices 112, 113 and 116 through 119 are identical matched n-channel units. The devices 114, 115, 124, 126, 128 and 130 are also identical matched n-channel units. By way of example, $V_{DD}$ in FIG. 8 is $+5$ volts and $V_{SS}$ therein is $-5$ volts.

FIG. 8 is a specific illustrative example of an advantageous arrangement capable of functioning as a variable transconductance element. One version of the arrangement is characterized by a three-volt dynamic input signal range, approximately 0.3 percent total harmonic distortion and a 30 megahertz bandwidth.

A prespecified value of transconductance for the FIG. 8 arrangement can be established by appropriate scaling of the four squaring devices 120 through 123. Alternatively, or as a supplementary measure, the output current $i_0$ can be scaled in a standard way with the use of additional current mirrors.

Finally, it is to be understood that the abovedescribed circuits and techniques are only illustrative of the principles of the present invention. In accordance with these principles, numerous modifications and alternatives may be devised by those skilled in the art without departing from the spirit and scope of the invention.

What is claimed is:

1. Apparatus for maintaining the transconductances of variable transconductance elements substantially temperature-insensitive, said apparatus comprising
    a primary variable transconductance element having a transconductance $G_{VTE}$,
    a switched-capacitor circuit having a conductance C/T, where C is the capacitance of the switched capacitor and T is the switching period thereof,
    means for providing a reference voltage to said primary element and to said circuit,
    and means responsive to currents respectively supplied by said element and said circuit for generating a control voltage which is applied to said element to maintain said currents equal whereby $G_{VTE}$ is determined by C/T.

2. Apparatus as in claim 1 further including matched and ratioed secondary variable transconductance elements each connected to said generating means to have said same control voltage applied thereto.

3. Apparatus as in claim 2 wherein said primary and secondary elements are formed on a single integrated circuit chip.

4. Apparatus as in claim 3 wherein said generating means comprises an integrator,
    means connected to the output of said integrator for periodically sampling and holding a voltage representative of the output of said integrator,
    and means for applying said representative voltage to each of said elements to maintain the transconductances thereof substantially constant.

5. Apparatus as in claim 4 wherein each of said primary and secondary elements comprises a single MOSFET device, and wherein said reference voltage is supplied by a constant voltage source.

6. Apparatus in claim 4 wherein each of said primary and secondary elements comprises a circuit, including only multiple MOSFET devices, for providing an output current linearly proportional to the product of two input voltages, and wherein said reference voltage is supplied by a constant voltage source.

7. Apparatus as in claims 5 or 6 wherein said secondary elements are constituent parts of a continuous signal active filter.

8. Apparatus for maintaining a bias current substantially temperature-insensitive, said apparatus comprising
    two matched MOSFET devices connected as a current mirror, the steady-state current in each device of said pair being designated I,
    a switched-capacitor circuit having a conductance C/T, where C is the capacitance of the switched-capacitor and T is the switching period thereof,
    means for providing a constant reference voltage $V_R$ to said circuit, and means responsive to the current flowing in one of said devices and to the current supplied by said circuit for applying a signal to the other one of said devices to maintain the current flowing therein equal to the current supplied by said circuit whereby the currents flowing in said respective devices are thereby respectively maintained substantially constant to a value $$\frac{CV_R}{T}.$$

9. Apparatus as in claim 8 further comprising an associated circuit whose current is to be maintained constant independent of temperature variations, said associated circuit including means responsive to said signal for maintaining the current in said associated circuit constant at the value $$\frac{CV_R}{T}.$$

10. Apparatus for maintaining the transconductance of a differential pair of MOSFET devices substantially temperature-insensitive, said apparatus comprising
two matched MOSFET devices connected as a current mirror, the steady-state current in each device of said pair being designated I,
a switched-capacitor circuit having a conductance C/T, where C is the capacitance of the switched-capacitor and T is the switching period thereof,
means for providing a voltage source $V_R$ for said switched-capacitor circuit wherein $$V_R = \sqrt{\frac{I}{k}},$$

where k is a temperature-dependent parameter associated with each MOSFET device,
means responsive to the current flowing in one of said current-mirror devices and to the current supplied by said circuit for applying a signal to the other one of said current-mirror devices to maintain the current flowing therein equal to the current supplied by said circuit whereby the currents flowing in said respective current-mirror devices are thereby respectively maintained at a value $$\frac{C^2}{T^2 k},$$

and means connected to said differential pair and responsive to said signal for maintaining the current flow through each device of said pair at the value $$\frac{C^2}{T^2 k}.$$

11. A method of maintaining the transconductance of at least a primary variable transconductance element substantially insensitive to temperature variations, said method comprising the steps of
matching the transconductance of said primary element against the conductance of a switched-capacitor,
and, in the event of a mismatch, generating a control voltage to apply to said primary element to maintain its tranconductance substantially constant.

12. A method as in claim 11 further including the step of applying said same control voltage to at least one secondary variable transconductance element that is a matched and ratioed version of the primary element, thereby to maintain the transconductance(s) of said secondary element(s) substantially constant also.

13. A method of establishing a current and maintaining it substantially constant independent of temperature variations, said method comprising the steps of
matching a reference current against a substantially temperature-insensitive current I supplied by a switched-capacitor, wherein $$I = \frac{CV_R}{T},$$

where C is the capacitance of the switched-capacitor, $V_R$ is the value of a voltage reference connected to the switched-capacitor and T is the clocking period of the switched-capacitor,
and, upon a mismatch, generating a signal to establish and maintain said reference current at said value I.

* * * * *